United States Patent
Millward et al.

(10) Patent No.: US 12,264,074 B2
(45) Date of Patent: Apr. 1, 2025

(54) SYNTHESIS OF 1,1,1-TRICHLORODISILANE

(71) Applicant: NATA Semiconductor Materials CO., LTD., Chuzhou (CN)

(72) Inventors: Andrew Millward, Midland, MI (US);
Brian D. Rekken, Midland, MI (US);
Travis Sunderland, Midland, MI (US);
Jeanette K. Young, Midland, MI (US);
Xiaobing Zhou, Midland, MI (US)

(73) Assignee: NATA SEMICONDUCTOR MATERIALS CO., LTD., Chuzhou (CN)

( * ) Notice: Subject to any disclaimer, the term of this patent is extended or adjusted under 35 U.S.C. 154(b) by 162 days.

(21) Appl. No.: 16/710,625

(22) PCT Filed: Jun. 21, 2018

(86) PCT No.: PCT/US2018/038711
§ 371 (c)(1),
(2) Date: Jan. 11, 2020

(87) PCT Pub. No.: WO2019/005571
PCT Pub. Date: Jan. 3, 2019

(65) Prior Publication Data
US 2024/0253997 A1  Aug. 1, 2024

Related U.S. Application Data

(60) Provisional application No. 62/526,680, filed on Jun. 29, 2017.

(51) Int. Cl.
*C01B 33/107* (2006.01)
*C23C 16/24* (2006.01)

(52) U.S. Cl.
CPC ........ *C01B 33/10773* (2013.01); *C23C 16/24* (2013.01)

(58) Field of Classification Search
None
See application file for complete search history.

(56) References Cited

U.S. PATENT DOCUMENTS 3,499,020 A * 3/1970 Robinson .............. C01B 33/043
556/179
5,015,624 A * 5/1991 Schulz, Jr. ............ C07F 7/0896
556/474
7,540,920 B2 * 6/2009 Singh ...................... C01B 33/04
117/89

FOREIGN PATENT DOCUMENTS

JP      2940120 B2 * 8/1999
JP   2004115388 A  * 4/2004

OTHER PUBLICATIONS

Translation of JP-2004115388-A (Year: 2004).*
Translation of JP-2940120-B2 (Year: 1999).*

* cited by examiner

*Primary Examiner* — Michael Forrest
(74) *Attorney, Agent, or Firm* — Morgan, Lewis & Bockius LLP

(57) ABSTRACT

A method of making a trihalodisilane, the method comprising: combining a reductive effective amount of an alkylaluminum hydride, a halodisilane comprising at least 4 halogen atoms, and a solvent at a temperature <80° C. and reducing the halodisilane to form a reaction product mixture comprising a trihalodisilane and an alkylaluminum halide.

13 Claims, No Drawings

SYNTHESIS OF 1,1,1-TRICHLORODISILANE

CROSS-REFERENCE TO RELATED APPLICATIONS

This application claims the benefit of International Application PCT/US18/038711, filed on Jun. 21, 2018, which claims the benefit of U.S. application Ser. No. 62/526,680, filed on Jun. 29, 2017.

FIELD OF THE INVENTION

This invention relates to a method of synthesizing trichlorodisilane comprising combining an alkylaluminum hydride, a halodisilane, and a solvent, at a temperature <80° C. and reducing the halodisilane to form the trihalodisilane.

BACKGROUND OF THE INVENTION

Silanes and chlorosilanes may be used to deposit silicon-containing films on a substrate in processes such as chemical vapor deposition, atomic layer deposition, and plasma enhanced chemical vapor and atomic layer deposition. Trichlorodisilane is a promising silane precursor for depositing silicon-containing films in these film deposition processes.

Trichlorodisilane has been made by various methods. For example, hexachlorodisilane has been reduced with diethylaluminum hydride, but this method produces unacceptable amounts of ethylsilane byproduct. Minimization of the ethylsilane byproduct in this method has been accomplished by including ethylaluminum dichloride in the reduction of the hexachlorodisilane. It has also been made by coupling silane $SiH_4$ and silicon tetrachloride in a chemical vapor deposition reactor.

These known methods of producing trichlorodisilane have drawbacks that make them unattractive for production on an industrial scale including insufficient selectivity, inadequate yields, production of undesirable, hard to separate byproducts from products, and use of costly or hazardous starting materials.

Therefore, there is a need for new methods of producing trichlorodisilane with good selectivity and yield, minimal undesirable byproducts, that easily separate product and byproducts, and that use cost effective starting materials.

BRIEF SUMMARY OF THE INVENTION

The present invention is directed to a method of making a trihalodisilane, the method comprising: combining a reductive effective amount of an alkylaluminum hydride, a halodisilane comprising at least 4 halogen atoms, and a solvent, at a temperature <80° C. and reducing the halodisilane to form a reaction product mixture comprising a trihalodisilane, an alkylaluminum halide, and the solvent.

The method produces trihalodisilane cost effectively, with good selectivity and yield, with small amounts of byproducts, and efficiently separates trihalodisilane product from byproducts.

DETAILED DESCRIPTION OF THE INVENTION

A method of making a trihalodisilane, the method comprising:
combining a reductive effective amount of an alkylaluminum hydride, a halodisilane comprising at least 4 halogen atoms, and a solvent at a temperature <80° C. and reducing the halodisilane to form a reaction product mixture comprising a trihalodisilane, an alkylaluminum halide, and the solvent.

The alkylaluminum hydride comprises 1-2, alternatively 1, alternatively 2, alkyl groups. The alkyl groups have 3 or more, alternatively 4-20, alternatively 4-10 carbon atoms. Examples of alkyl groups of the alkylaluminum hydride include, but are not limited, propyl, isopropyl, butyl, isobutyl, pentyl, isopentyl, hexyl, heptyl, nonyl, decyl, and their isomers. In one embodiment, the alkyl group is isobutyl.

Examples of the alkylaluminum hydride include, but are not limited to, diisobutylaluminum hydride. Alkylaluminum hydrides, such as diisobutylaluminum hydride, are available commercially.

The halodisilane comprising at least 4, alternatively 4-6, alternatively 5, alternatively 6, halogen atoms. The halogen atoms of the halodisilane are fluoro, chloro, bromo, or iodo, alternatively fluoro, bromo, or chloro, alternatively chloro.

Examples of the halodisilane include, but are not limited to, hexachlorodisilane, pentachlorodisilane, and tetrachlorodisilane. Halodisilanes comprising at least 4 halogen atoms are available commercially or may be made in known processes. For example, hexachlorodisilane may be made in the direct process where silicon metal is directly reacted with hydrogen chloride.

The solvent is any solvent that will solubilize the halodisilane having at least 4 halogen atoms, is not reactive with the halodisilane comprising at least 4 halogen atoms, the alkylaluminum hydride, or the trihalodisilane. In one embodiment the solvent has a boiling point greater than trihalodisilane, alternatively >90° C., alternatively >120° C., alternatively >200° C., alternatively from 150 to 350° C., alternatively from 200 to 300° C., at standard temperature and pressure, alternatively 1 atm (101.33 kPa) and 0° C.). The solvent is different than the halodisilane comprising at least 4 halogen atoms or the alkylaluminum hydride.

Examples of solvents include aromatic or non-aromatic cyclic or non-cyclic hydrocarbons including toluene, xylenes, trimethylbenzenes, isopropylbenzene, diisopropylbenzenes, heptanes, alkanes, and polar aprotic solvents including acyclic ethers, such as monoglyme, alternatively aromatic hydrocarbons, straight or branched chain aliphatic hydrocarbon, and acyclic ethers.

The solvent may be a mixture of different solvents compatible (i.e., miscible and non-reactive) with the halodisilane having at least 4 halogen atoms, the alkylaluminum hydride, and product mixture, alternatively the solvent may be a mixture of solvents which are compatible with the halodisilane having at least 4 halogen atoms, the alkylaluminum hydride, and product mixture and having a portion of the solvent mixture with a boiling point as described above for the solvent. An example of a mixture of solvents includes mineral spirits. Many of these solvents are available commercially.

The alkylaluminum hydride, halodisilane comprising at least 4 halogen atoms, and solvent may be combined by methods known in the art. In one embodiment, the alkylaluminum hydride, the halodisilane comprising at least 4 halogen atoms, and the solvent are combined by combining the solvent and the halodisilane comprising at least 4 halogen atoms to form a halodisilane-solvent mixture and then combining the halodisilane-solvent mixture with the alkylaluminum hydride, alternatively the alkylaluminum hydride, the halodisilane, and the solvent are combined by combining the solvent and the halodisilane to form a halodisilane-solvent mixture and then combining the alkylaluminum hydride with a second solvent to form an alkylaluminum hydride-solvent mixture and then combining the halodisilane-solvent mixture and the alkylaluminum hydride-solvent mixture.

In one embodiment, the alkylaluminum hydride or the alkylaluminum hydride-solvent mixture is added to the halodisilane-solvent mixture. For example, the alkylaluminum hydride-second solvent mixture may be added via an addition funnel to a round bottom flask or reactor comprising the halodisilane-solvent mixture. One skilled in the art would know how to add the alkylaluminum hydride or the alkylaluminum hydride-second solvent mixture to the halodisilane-solvent mixture The second solvent may be the same as or different from the solvent combined with the halodisilane comprising at least 4 halogen atoms and described above, alternatively the second solvent is the same as the solvent combined with the halodisilane having at least 4 halogen atoms and described above. The second solvent has a boiling point as described above for the solvent. Examples of the second solvent are as described above for the solvent combined with the halodisilane comprising at least 4 halogen atoms. Many of the solvents that may be used as the second solvent are available commercially.

The halodisilane is reduced by the alkylaluminum hydride to form a reaction product mixture comprising a trihalodisilane, an alkylaluminum halide, and the solvent.

The trihalodisilane is 1,1,1-trihalodisilane, alternatively 1,1,1-trichlorodisilane.

The alkyl groups of the alkylaluminum halide are as described above for the alkylmetal hydride. The halide is the same halogen atom as comprised by the halodisilane comprising at least 4 halogen atoms described above. An example of the alkylaluminum halide includes, but is not limited to, diisobutylaluminum chloride.

The weight ratio of solvent to halodisilane comprising at least 4 halogen atoms is from 20:1 to 1:20, alternatively from 10:1 to 1:10, alternatively from 6:1 to 1:6, alternatively from 2:1 to 1:2, alternatively from 1.5:1 to 1:1.5, alternatively 1.25:1 to 1:1.25, alternatively about 1:1.

The weight ratio of second solvent to alkylaluminum hydride is from 50:1 to 1:50, alternatively from 10:1 to 1:10, alternatively from 5:1 to 1:5, alternatively 2:1 to 1:2, alternatively from 1.5:1 to 1:1.5, alternatively 1.25:1 to 1:1.25, alternatively about 1:1.

The halodisilane comprising at least 4 halogen atoms, solvent and the alkylaluminum hydride are combined at a temperature from −30 to 80° C., alternatively from −30 to 50° C., alternatively from −30 to 25° C., alternatively from −30 to 20° C., alternatively from −10 to 10° C. In embodiments first comprising the combining of the halodisilane comprising at least 4 halogen atoms with the solvent, and the combining of the alkylaluminum halide with a second solvent, the temperature at which the halodisilane and the solvent and the alkylaluminum hydride and the second-solvent are combined can vary, but these mixtures are combined with each other at a temperature from −30 to 80° C., alternatively −30 to 50° C., alternatively −30 to 25° C., alternatively from −30 to 20° C., alternatively from −10 to 10° C.

The halodisilane comprising at least 4 halogen atoms, solvent and the alkylaluminum hydride are combined at a pressure from sub-atmospheric to super-atmospheric, alternatively atmospheric pressure, alternatively from 90 kPa to 110 kPa.

The halodisilane comprising at least 4 halogen atoms, solvent and the alkylaluminum hydride are combined until the halodisilane comprising at least 4 halogen atoms is reduced to the trihalodisilane, alternatively from 3 minutes to 8 hours, alternatively from 30 minutes to 5 hours, alternatively from 45 minutes to 2 hours, or until trihalodisilane production has ceased. Alternatively, the reaction may be continued until an amount of trihalodisilane is made or an amount of halodisilane comprising at least 4 halogen atoms is consumed by the process. The production of the trihalodisilane or consumption of the halodisilane comprising at least 4 halogen atoms can be determined by, for example, gas chromatography with thermal conductivity detector. One skilled in the art would know the appropriate gas chromatography columns and conditions to track trihalodisilane production. For example, Gas Chromatography-Thermal Conductivity Detector (GC-TCD) instrument and conditions follow: a capillary column with 30 meters length, 0.32 mm inner diameter, and containing a 0.25 μm thick stationary phase in the form of a coating on the inner surface of the capillary column, wherein the stationary phase is composed of phenyl methyl siloxane. Carrier gas is helium gas used at a flow rate of 105 mm per minute. GC instrument may be an Agilent model 7890A gas chromatograph. Inlet temperature is 200° C. GC experiment temperature profile consists of soaking (holding) at 50° C. for 2 minutes, ramping temperature up at a rate of 15° C./minute to 250° C., and then soaking (holding) at 250° C. for 10 minutes.

The reactor for the combination and reduction may be any reactor typically used for such reactions. Examples of rectors include round bottom flasks, Parr reactors, and pressure tubes. One skilled in the art would know how to select the appropriate reactor for the method of the invention.

The molar ratio of the alkylaluminum hydride to halodisilane comprising at least 4 halogen atoms is from 10:1 to 1:10, alternatively 5:1 to 2:1, alternatively from 3:1 to 3.5:1. The molar ratio refers to the amount of alkylaluminum hydride and halodisilane and does not include the solvent or any other materials.

The method may further comprise recovering the trihalodisilane. The trihalodisilane may be recovered by methods known in the art. In one embodiment, the trihalodisilane is recovered by distillation under vacuum. For example, the reaction product may be brought to a temperature of around 80° C. and the product trihalodisilane stripped from the product mixture under vacuum into a cooled collection container. The trihalodisilane may be distilled one or more additional times to purify the trihalodisilane further. One skilled in the art would know how to recover the trihalodisilane by distillation. Use of the solvent with a boiling point greater than the trihalodisilane allows for efficient recovery of the trihalodisilane and production of a trihalodisilane composition with high purity.

A trihalodisilane composition, comprising: <2% (w/w), alternatively <1% (w/w), alternatively <0.5% (w/w), alternatively from 0.01 to 0.5% (w/w) of an alkylsilane and >98% (w/w), alternatively >99% (w/w), alternatively >99.5% (w/w), alternatively 99.99% (w/w) of the trihalodisilane. The alkyl of the alkylsilane is the same as that of the alkylaluminum hydride. The trihalodisilane composition may comprise small amounts of other impurities such as monochlorosilane, trichlorosilane, dichlorodisilane.

The trihalodisilane is as described above for the method of the invention. In one embodiment, the alkylsilane is a byproduct of the method of the invention and comprises a silane with the alkyl group as described for the alkylaluminum hydride. Examples of the alkylsilane include silane or disilane having one or more isobutyl groups bonded to a silicon atom, alternatively isobutylsilane, alternatively isobutyldisilane.

The trihalodisilane composition may further comprise an alkylaluminum halide. The alkylaluminum halide is as described above for the method of the invention. The trihalodisilane composition comprises <2% (w/w), alternatively <1% (w/w), alternatively <0.5% (w/w) of alkylaluminum halide.

The method of the invention allows for the production of a high purity 1,1,1-trichlorodisilane.

A method of depositing a silicon-containing film on a substrate, the method comprising, introducing the trihalodisilane produced by combining a reductive effective amount of an alkylaluminum hydride, a halodisilane comprising at least 4 halogen atoms, and a solvent, wherein the solvent has a boiling point>the boiling point of the trihalodisilane, at a temperature <80° C. and reducing the halodisilane to form a reaction product mixture comprising a trihalodisilane and an alkylaluminum halide, into a reactor with a substrate and, optionally, additional reactants under deposition sufficient conditions to form a silicon-containing film on the substrate.

The trihalodisilane and the method of making the trihalodisilane, the alkylaluminum hydride, the halodisilane comprising at least 4 halogen atoms, the solvent, the trihalodisilane, and the alkylaluminum halide are as described above. The alkylaluminum hydride may also be combined with a second solvent as described above prior to combining with the halodisilane-solvent mixture as described above.

The reactor is any reactor known in the art for depositing a silicon-containing film on a substrate. One skilled in the art would know the reactors to use for depositing silicon-containing films. Examples of reactors include, but are not limited to, reactors used for atomic layer deposition (ALD), plasma-enhanced atomic layer deposition (PEALD), cyclic chemical vapor deposition (cyclic CVD), chemical vapor deposition (CVD), and plasma-enhanced chemical vapor deposition (PECVD).

The silicon containing films may be deposited by methods known for depositing silicon-containing films including, but not limited to, atomic layer deposition, plasma-enhanced atomic layer deposition, cyclic chemical vapor deposition, chemical vapor deposition, and plasma-enhanced chemical vapor deposition.

Additional reactants may be included in the reactor for depositing a silicon-containing film include, but are not limited to, oxygen and oxygen containing compounds such as ozone, nitrogen and nitrogen containing compounds such as ammonia and plasma.

EXAMPLES

The following examples are included to demonstrate preferred embodiments of the invention. It should be appreciated by those of skill in the art that the techniques disclosed in the examples which follow represent techniques discovered by the inventor to function well in the practice of the invention, and thus can be considered to constitute preferred modes for its practice. However, those of skill in the art should, in light of the present disclosure, appreciate that many changes can be made in the specific embodiments which are disclosed and still obtain a like or similar result without departing from the spirit and scope of the invention. All percentages are in wt. % unless otherwise noted. Room temperature is 25° C.

TABLE 1

List of abbreviations used in the examples.

| Abbreviation | Word |
|---|---|
| g | gram |
| Me | methyl |
| wt | weight |
| % | percent |
| mol | mole |
| hr | hour |
| ° C. | Degrees Celsius |
| NA | Not Applicable |
| mL | milliliters |
| Solids Content | (wt. of dried sample/wt. of initial sample) × 100 and determined as described below |
| mm | millimeters |
| cm | Centimeter |
| GC/GC-TCD | Gas Chromatography-Thermal Conductivity Detector. |
| eq | Equivalents |
| DIBAH | Diisobutylaluminum hydride |
| HCDS | Hexachlorodisilane |
| DiPB | 1,3-diisopropylbenzene |

GC-TCD Test Method/Conditions

Gas Chromatography-Thermal Conductivity Detector (GC-TCD) instrument and conditions: a capillary column with 30 meters length, 0.32 mm inner diameter, and containing a 0.25 µm thick stationary phase in the form of a coating on the inner surface of the capillary column, wherein the stationary phase was composed of phenyl methyl siloxane. Carrier gas was helium gas used at a flow rate of 105 mm per minute. GC instrument was an Agilent model 7890A gas chromatograph. Inlet temperature was 200° C. GC experiment temperature profile consisted of soaking (holding) at 50° C. for 2 minutes, ramping temperature up at a rate of 15° C./minute to 250° C., and then soaking (holding) at 250° C. for 10 minutes.

Comparative Example 1

In a glovebox, hexachlorodisilane (HCDS, 10.06 g) and 1,3-diisopropylbenzene (DiPB, 10.00 g) were loaded into a 250 mL 3-neck round bottom flask equipped with an addition funnel, a glass thermowell and a distillation column attached to a distillation bridge and a 100 mL jacketed round bottom collection flask. The addition funnel was loaded with a mixture of diisobutylaluminum hydride (DIBAH, 17.47 g, 3.3 eq) and DiPB (17.44 g). The pot was heated to 80° C. and the power was turned off. The DIBAH/DiPB addition rate was controlled to maintain a pot temperature between 75-80° C. and the addition was complete after 10 minutes. Following the addition, the pot was heated at 80° C. for an addition 10 minutes, followed by a strip distillation at 80° C. under full active vacuum into a cooled collection flask. The isolated material was 1.77 g and a sample was analyzed by GC. The stripped material contained 50.0% (w/w) 1,1,1-trichlorodisilane (3CDS), 35.9% combined total all other disilanes, and 2.0% isobutylsilane (4.0% relative to 1,1,1-trichlorodisilane).

Comparative Example 2

In a glovebox, hexachlorodisilane (HCDS, 10.02 g) was loaded into a 250 mL 3-neck half-jacketed round bottom flask equipped with an addition funnel, a glass thermowell and a distillation column attached to a distillation bridge and a 100 mL jacketed round bottom collection flask. The addition funnel was loaded with diisobutylaluminum hydride (DIBAH, 17.45 g, 3.3 eq). The pot was cooled to 3.2° C. and the DIBAH was added to the HCDS dropwise over 55 minutes, resulting in a maximum pot temperature of 5.5° C. Following the addition, the pot was stirred for 15 minutes and then warmed to room temperature (25° C.) in 10° C. increments. Once at room temperature, the mixture was transferred to a 250 mL 3-neck round bottom flask, heated to 80° C., and strip distilled at 80° C. pot temperature under static vacuum at −26 inches of Hg into a cooled collection flask. The isolated material was 3.64 g and a sample was analyzed by GC. The stripped material contained 74.9% 1,1,1-trichlorodisilane, 22.4% combined total all other disilanes, and 0.8% isobutylsilane (1.1% relative to 1,1,1-trichlorodisilane).

Example 1

In a glovebox, hexachlorodisilane (HCDS, 9.23 g) and 1,3-diisopropylbenzene (DiPB, 9.24 g) were loaded into a 250 mL 3-neck half-jacketed round bottom flask equipped with an addition funnel, a glass thermowell and a distillation column attached to a distillation bridge and a 100 ml jacketed round bottom collection flask. The addition funnel was loaded with diisobutylaluminum hydride (DIBAH, 16.12 g, 3.3 eq) and DiPB (16.12 g). The pot was cooled to −9.3° C. and the DIBAH/DiPB mixture was added to the HCDS dropwise over 55 minutes, resulting in a maximum pot temperature of −6.6° C. Following the addition, the pot was stirred for 20 minutes and then warmed to room temperature in 10° C. increments. Once at room temperature, the mixture was transferred to a 250 mL 3-neck round bottom flask, heated to 80° C., and strip distilled at 80° C. pot temperature under full active vacuum into a cooled collection flask. The isolated material was 2.16 g and a sample was analyzed by GC. The stripped material contained 90.5% 1,1,1-trichlorodisilane, 8.4% combined total all other disilanes, and 0.07% isobutylsilane (0.08% relative to 1,1,1-trichlorodisilane).

Example 2

In a glovebox, hexachlorodisilane (HCDS, 10.01 g) and 1,3-diisopropylbenzene (DiPB, 10.00 g) were loaded into a 250 mL 3-neck half-jacketed round bottom flask equipped with an addition funnel, a glass thermowell and a distillation column attached to a distillation bridge and a 100 mL jacketed round bottom collection flask. The addition funnel was loaded with diisobutylaluminum hydride (DIBAH, 17.45 g, 3.3 eq). The pot was cooled to −9.3° C. and the DIBAH was added to the HCDS dropwise over 55 minutes, resulting in a maximum pot temperature of −6.4° C. Following the addition, the pot was stirred for 25 minutes and then warmed to room temperature in 10° C. increments. Once at room temperature, the mixture was transferred to a 250 mL 3-neck round bottom flask, heated to 80° C., and strip distilled at 80° C. pot temperature under full active vacuum. The isolated material was 3.72 g and a sample was analyzed by GC. The stripped material contained 90.7% 1,1,1-trichlorodisilane, 8.1% combined total all other disilanes, and 0.05% isobutylsilane (0.06% relative to 1,1,1-trichlorodisilane).

Example 3

In a glovebox, hexachlorodisilane (HCDS, 9.99 g) and 1,3-diisopropylbenzene (DiPB, 10.00 g) were loaded into a 250 mL 3-neck half-jacketed round bottom flask equipped with an addition funnel, a glass thermowell and a distillation column attached to a distillation bridge and a 100 ml jacketed round bottom collection flask. The addition funnel was loaded with diisobutylaluminum hydride (DIBAH, 15.87 g, 3.0 eq). The pot was cooled to −1.6° C. and the DIBAH was added to the HCDS dropwise over 50 minutes, resulting in a maximum pot temperature of 1.8° C. Following the addition, the pot was stirred for 20 minutes and then warmed to room temperature in 10° C. increments. Once at room temperature, the mixture was transferred to a 250 mL 3-neck round bottom flask, heated to 80° C., and strip distilled at 80° C. pot temperature under static vacuum at −26 inches of Hg. The isolated material was 4.03 g and a sample was analyzed by GC. The stripped material contained 86.2% 1,1,1-trichlorodisilane, 13.0% combined total all other disilanes, and 0.05% isobutylsilane (0.06% relative to 1,1,1-trichlorodisilane).

TABLE 2

Results of Examples and Comparative Examples.

| Examples | GC-TCD Integrations (%) | | | GC-TCD Integrations of Isobutylsilane Relative to That of 1,1,1-trichlorodisilane |
|---|---|---|---|---|
| | 1,1,1-trichlorodisilane | Other Chloro-disilanes | Iso-butylsilane | |
| Comparative Example 1 | 50.0 | 35.9 | 2.0 | 4.0 |
| Comparative Example 2 | 74.9 | 22.4 | 0.8 | 1.1 |
| Inventive Example 1 | 90.5 | 8.4 | 0.07 | 0.08 |
| Inventive Example 2 | 90.7 | 8.1 | 0.05 | 0.06 |
| Inventive Example 3 | 86.2 | 13.0 | 0.05 | 0.06 |

The results indicate the improved results from including solvent and conducting the combining and reduction at low temperatures.

That which is claimed is:

1. A method of making a trihalodisilane, the method comprising:
combining a reductive effective amount of an alkylaluminum hydride, a halodisilane comprising at least 4 halogen atoms, and a solvent at a temperature <150° C. and reducing the halodisilane to form a reaction product mixture comprising a trihalodisilane, an alkylaluminum halide, and the solvent.

2. The method according to claim 1, wherein the solvent has a boiling point>the boiling point of the trihalodisilane, and the combining is at a temperature of <25° C.

3. The method according to claim 1, wherein the alkylaluminum hydride is diisobutylaluminum hydride and the halodisilane is hexachlorodisilane.

4. The method according to claim 1, wherein the molar ratio of the alkylaluminum hydride to halodisilane is from 3:1 to 3.5:1.

5. The method according to claim 1, further comprising: combining the solvent and the halodisilane to form a halodisilane-solvent mixture and combining the halodisilane-solvent mixture formed with the alkylaluminum hydride.

6. The method according to claim 5, further comprising: combining the alkylaluminum hydride with a second solvent to form an alkylaluminum hydride-solvent mixture, and combining the halodisilane-solvent mixture with the alkylaluminum hydride by adding the alkylaluminum hydride-solvent mixture to the halodisilane-solvent mixture.

7. The method according to claim 1, further comprising recovering the trihalodisilane.

8. The method according to claim 7, wherein the trihalodisilane is recovered by distillation.

9. The method according to claim 1, wherein the trihalodisilane is 1,1,1-trichlorodisilane and the alkylaluminum halide is diisobutylaluminum chloride.

10. A trihalodisilane composition, comprising: <2% (w/w) of an alkylsilane and >98% (w/w) of a trihalodisilane, wherein the composition further comprises an alkylaluminum halide.

11. A method of depositing a silicon-containing film on a substrate, the method comprising, introducing a trihalodisilane composition into a reactor with a substrate and, optionally, additional reactants under deposition sufficient conditions to form a silicon-containing film on the substrate, wherein the trihalodisilane composition comprises <2% (w/w) of an alkylsilane, >98% (w/w) of a trihalodisilane, and an alkylaluminum halide.

12. The method according to claim 11, wherein the additional reactant is oxygen or nitrogen.

13. The method according to claim 11, wherein the silicon-containing film is deposited by ALD, PEALD, cyclic CVD, CVD or PECVD.

* * * * *